(12) United States Patent
Novikov et al.

(10) Patent No.: US 9,885,110 B2
(45) Date of Patent: Feb. 6, 2018

(54) PRESSURE MODULATED COATING

(71) Applicant: United Technologies Corporation, Hartford, CT (US)

(72) Inventors: Dmitri Novikov, Avon, CT (US); Sergei F. Burlatsky, West Hartford, CT (US); David Ulrich Furrer, Marlborough, CT (US); David A. Litton, West Hartford, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 0 days.

(21) Appl. No.: 14/810,767

(22) Filed: Jul. 28, 2015

(65) Prior Publication Data
US 2016/0040284 A1 Feb. 11, 2016

Related U.S. Application Data

(60) Provisional application No. 62/033,885, filed on Aug. 6, 2014.

(51) Int. Cl.
*C23C 14/54* (2006.01)
*C23C 14/22* (2006.01)
*C23C 14/24* (2006.01)
*F01D 25/00* (2006.01)

(52) U.S. Cl.
CPC ............ *C23C 14/54* (2013.01); *C23C 14/228* (2013.01); *C23C 14/243* (2013.01); *F01D 25/005* (2013.01)

(58) Field of Classification Search
None
See application file for complete search history.

(56) References Cited

U.S. PATENT DOCUMENTS

| | | | |
|---|---|---|---|
| 3,639,151 A | 2/1972 | Krutenat | |
| 3,889,019 A | 6/1975 | Blecherman et al. | |
| 4,926,439 A | 5/1990 | Johnson et al. | |
| 5,997,947 A | 12/1999 | Burns et al. | |
| 7,718,222 B2 | 5/2010 | Hass et al. | |
| 7,838,083 B1 | 11/2010 | Youchison et al. | |
| 7,879,187 B2 | 2/2011 | Jeon | |
| 8,506,715 B2 | 8/2013 | Neal | |

(Continued)

FOREIGN PATENT DOCUMENTS

| | | |
|---|---|---|
| JP | S5850629 | 3/1983 |
| JP | H09272966 | 10/1997 |

OTHER PUBLICATIONS

European Search Report for European Patent Application No. 15179938.4 completed Nov. 3, 2015.

*Primary Examiner* — Joseph Miller, Jr.
(74) *Attorney, Agent, or Firm* — Carlson, Gaskey & Olds, P.C.

(57) ABSTRACT

A method or control strategy in a coating apparatus for use in a coating process can include controlling differential gas pressures among multiple selected localized zones in a coating chamber with respect to each other. The controlled differential gas pressure of the multiple selected localized zones is used to influence how a coating deposits on at least one component. The localized zones can be selected from a first localized zone around the component, a second localized zone adjacent the source of coating material, a third localized zone that diverges from the second localized zone toward the first localized zone, and a fourth localized zone that circumscribes at least the third localized zone.

9 Claims, 2 Drawing Sheets

(56) References Cited

U.S. PATENT DOCUMENTS

| | | |
|---|---|---|
| 8,541,069 B2 | 9/2013 | Greenberg et al. |
| 2003/0203127 A1 | 10/2003 | Bruce et al. |
| 2008/0131611 A1 | 6/2008 | Hass et al. |
| 2008/0220177 A1 | 9/2008 | Hass et al. |
| 2009/0056625 A1 | 3/2009 | Loo et al. |
| 2009/0123646 A1 | 5/2009 | Varetti |
| 2011/0223353 A1 | 9/2011 | Neal et al. |
| 2012/0141677 A1 | 6/2012 | Honda et al. |

PRESSURE MODULATED COATING

CROSS-REFERENCE TO RELATED APPLICATION

The present disclosure claims priority to U.S. Provisional Patent Application No. 62/033,885, filed Aug. 6, 2014.

BACKGROUND

This disclosure relates to a coating process and equipment therefor.

Physical vapor deposition ("PVD") is one common method for depositing a coating, such as a metallic coating or a ceramic coating, on a substrate. One type of PVD process utilizes an electron beam gun to melt and evaporate a source coating material contained within a crucible. The evaporated source material condenses and deposits onto the substrate.

SUMMARY

A method for use in a coating process according to an example of the present disclosure includes locating at least one component within a coating chamber with respect to a source of coating material, controlling differential gas pressures of multiple selected localized zones in the coating chamber with respect to each other, and using the controlled differential gas pressures of the multiple selected localized zones to influence how a coating deposits on the at least one component. The localized zones are selected from a first localized zone around the at least one component, a second localized zone adjacent the source of coating material, a third localized zone that diverges from the second localized zone toward the first localized zone, and a fourth localized zone that circumscribes at least the third localized zone.

A further embodiment of any of the foregoing embodiments includes controlling the differential gas pressures of the first localized zone, the second localized zone, the third localized zone, and the fourth localized zone with respect to each other.

A further embodiment of any of the foregoing embodiments includes using of the controlled differential gas pressures of the multiple selected localized zones to influence how the coating deposits on the at least one component includes changing the differential gas pressures to shift a balance between coating material deposited onto surfaces of the at least one component that are in a line-of-sight of the source and coating material deposited onto surfaces of the at least one component that are shadowed from the line-of-sight to the source.

A further embodiment of any of the foregoing embodiments includes using of the controlled differential gas pressures of the multiple selected localized zones to influence how the coating deposits on the at least one component includes changing the differential gas pressures to shift between depositing the coating on the at least one component primarily from the source of coating material and depositing the coating on the at least one component primarily from a different source.

A further embodiment of any of the foregoing embodiments includes using of the controlled differential gas pressures of the multiple selected localized zones to influence how the coating deposits on the at least one component includes changing the differential gas pressures to change between two different mechanisms of deposition of the coating on the at least one component.

In a further embodiment of any of the foregoing embodiments, the two different mechanisms of deposition of the coating on the at least one component include a first mechanism of physical vapor deposition and a second mechanism of reactive process gas deposition.

A further embodiment of any of the foregoing embodiments includes using of the controlled differential gas pressures of the multiple selected localized zones to influence how the coating deposits on the at least one component includes changing the differential gas pressures to change a direction of impingement of the coating onto the at least one component.

A further embodiment of any of the foregoing embodiments includes emitting controlled frequency pressure waves in at least the first localized zone.

In a further embodiment of any of the foregoing embodiments, the controlling of the differential gas pressures of the multiple selected localized zones in the coating chamber with respect to each other includes establishing and maintaining a target pressure ratio between at least two of the differential gas pressures of the multiple selected localized zones In a further embodiment of any of the foregoing embodiments, the target pressure ratio is between the first localized zone and the second localized zone.

A further embodiment of any of the foregoing embodiments includes controlling gas pressure of the fourth localized zone with respect to area of a melt pool of the coating material at the source.

A further embodiment of any of the foregoing embodiments further includes controlling gas pressure of the fourth localized zone to be greater than a critical pressure defined with respect to area of a melt pool of the coating material at the source.

Also disclosed is an article or a coating produced by the foregoing embodiments.

A coating apparatus according to an example of the present disclosure includes a coating chamber including a crucible configured to support a source of coating material, an energy source operable to heat and evaporate the coating material, a fixture configured to support at least one component in a location to receive evaporated coating material from the crucible, and a plurality of gas ports configured to provide process gas into the interior of the coating chamber, a controller operable to at least control the energy source and gas flow from the plurality of gas ports. The controller is configured to operate at least the energy source and the gas flow from the plurality of gas ports to control differential gas pressures of multiple selected localized zones in the coating chamber with respect to each other to influence how a coating deposits on the at least one component. The localized zones are selected from a first localized zone around the at least one component, a second localized zone adjacent the crucible, a third localized zone that diverges from the second localized zone toward the first localized zone, and a fourth localized zone that circumscribes at least the third localized zone.

In a further embodiment of any of the foregoing embodiments, the plurality of gas ports includes at least a first port within a hood that partially encloses the at least one component and a second port that is located opposite the crucible from the fixture.

A method for use in a coating process according to an example of the present disclosure includes locating at least one component within a coating chamber with respect to a source of coating material, and dynamically changing differential gas pressures of multiple selected localized zones in the coating chamber with respect to each other to dynamically shift a balance between coating material deposited onto surfaces of the at least one component that are in a line-of-sight of the source and coating material deposited onto surfaces of the at least one component that are shadowed from the line-of-sight to the source. The localized zones are selected from a first localized zone around the at least one component, a second localized zone adjacent the source of coating material, a third localized zone that diverges from the second localized zone toward the first localized zone, and a fourth localized zone that circumscribes at least the third localized zone.

A further embodiment of any of the foregoing embodiments includes dynamically changing differential gas pressure between at least the first localized zone and the third localized zone.

A further embodiment of any of the foregoing embodiments includes dynamically decreasing differential gas pressure between at least the first localized zone and the third localized zone to shift the balance toward depositing the coating material onto the surfaces that are shadowed from the line-of-sight to the source.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
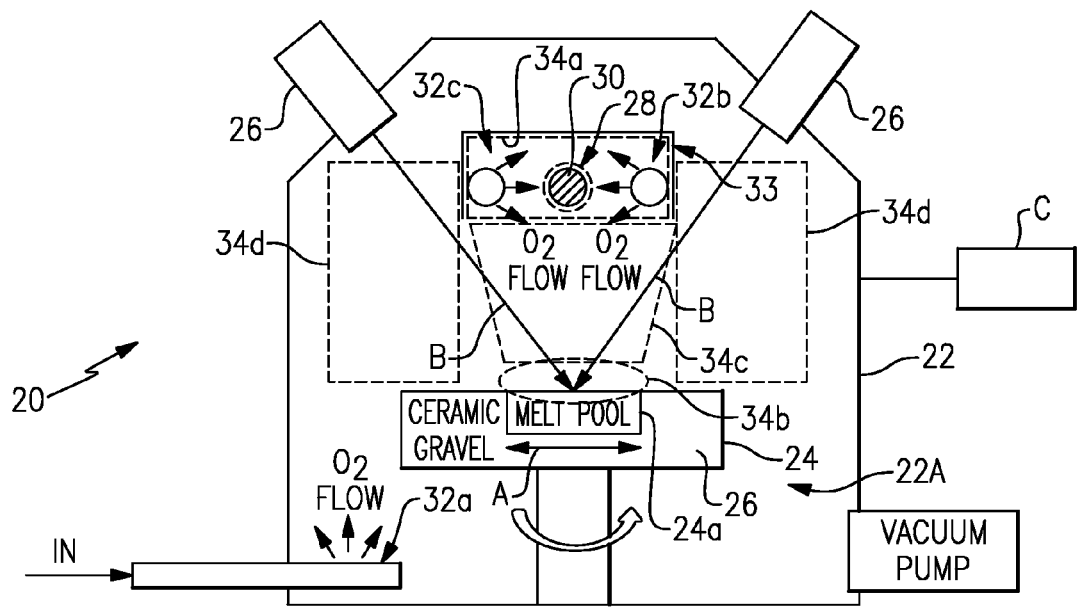
FIG. 1 illustrates an example coating apparatus.

FIG. 1 illustrates selected portions of an example coating apparatus 20 that can be used in conjunction with a method/control strategy, later described herein. For example, the coating apparatus 20 and control strategy described herein can be used in electron-beam physical vapor deposition to deposit one or more coatings on at least one component substrate. The examples may be described with reference to deposition of a ceramic coating onto a component/article, such as, but not limited to, gas turbine engine airfoils or airfoil multiplets of a plurality of airfoil vanes. It is to be understood, however, that the examples are also applicable to other coatings, other gas turbine engine components, and non-engine components.

Physical vapor deposition involves the vaporization of a source of coating material that then condenses onto the substrate component. For some types of substrates, an oxide scale (e.g., aluminum oxide) is grown on the substrate from an aluminum-containing bond coat prior to and during the deposition, to enhance bonding of a deposited ceramic topcoat. The oxide scale can be grown in a pre-heating step prior to and also during the deposition of the ceramic material, in the same chamber that the deposition is conducted in.

Physical vapor deposition is typically conducted under low vacuum conditions that are significantly less than $5 \times 10^{-4}$ torr. By comparison, the coating apparatus 20 and example control strategy described herein are designed for deposition at high pressure range, such as $5 \times 10^{-4}$ torr to $3 \times 10^{-1}$ torr. Low pressures are used to facilitate greater control over deposition. A drawback however is that the rate of deposition is relatively slow. In contrast, the high pressure range can enable much greater deposition rates but also presents additional challenges to coating quality. As will be described in further detail herein with regard to the coating apparatus 20 and example control strategy, differential gas pressures among multiple localized zones can be controlled with respect to each other to cooperatively influence how a coating deposits on one or more component substrates. For example, such a control strategy can be used to "fine tune" the coating process to overcome, or at least mitigate, challenges that arise from the higher deposition rates.

In the illustrated example, the coating apparatus 20 includes a coating chamber 22 that has a crucible 24 that is configured to support a source 26 of coating material. The coating material can be provided as a ceramic particulate (e.g., gravel), for example. The crucible 24 is supported within the interior of the chamber 24, which is represented at 22a. The crucible 24 can be a tray that holds particulate of the coating material. Alternatively, the crucible 24 can be adapted to hold and present an ingot of the coating material.

The coating chamber 22 further includes at least one energy source 26 that is operable to heat and evaporate the coating material in the crucible 24. In the illustrated example, the coating chamber 22 includes two such energy sources 26, such as electron-beam guns, that are operable to emit electron beams B toward the crucible 24 to melt and evaporate the coating material. Once melted, depending on the operating control parameters of the energy source or sources 26, a melt pool forms prior to evaporation.

The coating chamber 22 also includes a fixture 28 that is configured to support one or more components 30 in a location to receive evaporated coating material from the crucible 24. In this example, the fixture 28 supports the component 30 vertically above the crucible 24. The fixture 28 may be selectively moveable to adjust the position of the component 30 and/or to rotate the component 30. Additionally, the fixture 28 may be configured to support multiple components for batch coating.

The coating chamber 22 further includes gas ports, represented generally at 32a, 32b, and 32c. The gas ports 32a, 32b, and 32c are configured to provide process gas into the interior 22a of the coating chamber 24. As an example, the gas ports 32a, 32b, and 32c can include orifices through which process gas can be delivered. In another example, the gas ports 32a, 32b, 32c or combinations thereof can include individual manifolds that have multiple orifices for process gas delivery.

The process gas can be an inert gas with respect to reactivity with the material of the component 30 or a gas that is selected to react with a constituent of the material of the component 30 at a particular condition or temperature. Example process gases can include, but are not limited to, argon, hydrogen, and oxygen or oxygen-containing mixture, or mixtures thereof. For example, the process gas can include oxygen to deposit an oxide scale and/or participate in the deposition of the coating material from the crucible 24. Process gas sources and valving may be also be included within the manifold or a gas delivery system and operably connected with the controller for control over the supply of process gas into the interior 22a.

One or more vacuum pumps may also be operably connected with the interior 22a of the coating chamber 22, to facilitate control of gas pressure within the interior 22a. A controller, represented at C, is operably connected with the one or more energy sources 26 and the gas ports 32a, 32b, and 32c to control the operation thereof. As can be appreciated, the controller can include hardware, software, or both and can also be connected with other operational componentry of the coating apparatus 20.

Optionally, the coating chamber 22 also includes a hood 33 that partially encompasses the component 30. In this case, the gas ports 32b and 32c are located within the interior of the hood 33. The other gas port 32a is located opposite of the crucible 24 from the fixture 28, vertically below the crucible 24.

There are multiple localized zones within the interior 22a of the chamber 22. Through control over the gas ports 32a, 32b, and 32c and the energy source or sources 26, gas pressures in each localized zones can be controlled relative to each other. In this regard, differential gas pressures among the localized zones can be cooperatively controlled to influence how a coating deposits on the component 30.

In the illustrated example, the localized zones which are controlled can include a first localized zone 34a around the component 30, a second localized zone 34b adjacent the source 24a of coating material in the crucible 24, a third localized zone 34c that diverges from the second localized 34b toward the first localized zone 34a, and a fourth localized zone 34d that circumscribes at least the third localized zone 34c. Through control over the process gas delivered from the gas ports 32a, 32b, and 32c and control over the operation of the energy source or sources 26, the differential gas pressures among the localized zones 34a, 34b, 34c, and 34d can be controlled with respect to each other. As an example, the controller can control flow of process gas from the gas port 34a to influence the gas pressure in localized zone 34d. Similarly, the controller can control the process gas flow from gas ports 32b and 32c to influence gas pressure in localized zone 34a. The controller can also control the operation of the one or more energy sources 26 to influence the gas pressure in localized zone 34b. The gas pressure in localized zone 34c can be influenced by controlling the overall composite gas pressure within the interior 22a of the chamber 22.

The control of the differential gas pressures among the localized zones 34a, 34b, 34c and 34d influences how a coating deposits on the component 30. As used herein, reference to "how" a coating is deposited refers to deposition with respect to at least one of: the mechanism of deposition, the composition of the coating, the microstructure of the coating, the direction of impingement of coating material a surface of the component 30, the deposition rate, the coating uniformity, and combinations thereof.

An example method or control strategy for use in a coating process can include locating one or more of the components 30 within the coating chamber 32 with respect to the source of coating material in the crucible 24 and controlling differential gas pressures among the multiple localized zones 34a, 34b, 34c, and 34d with respect to each other. The controlled differential gas pressures are used to then influence how the coating deposits on the one or more component 30. The following examples further illustrate the use of control over the differential gas pressures to influence how a coating deposits.

Figure 2:
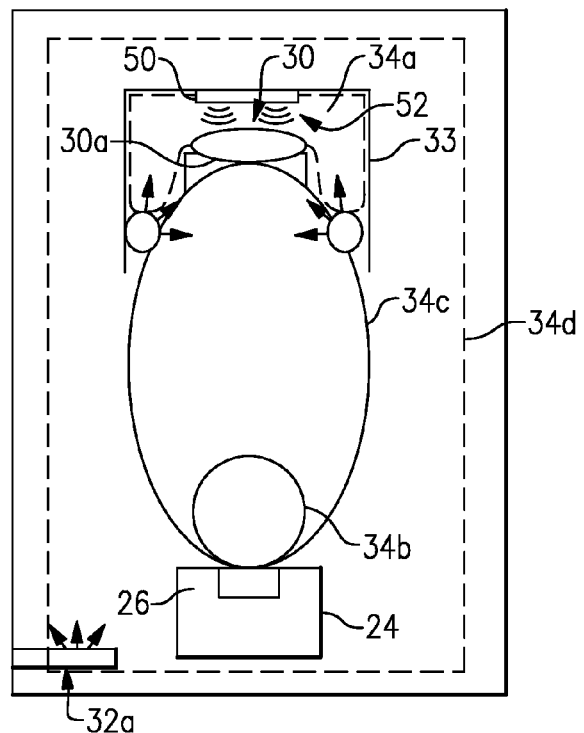
FIG. 2 is a schematic representation of a portion of a coating chamber in which differential gas pressures among localized zones are controlled with respect to each other to influence how a coating deposits on a component.

FIG. 2 illustrates a schematic representation of a portion of the coating chamber 22 in which the differential gas pressures among the localized zones 34a, 34b, 34c, and 34d are controlled with respect to each other to influence how a coating deposits on the component 30. In this example, the differential gas pressure between at least the first localized zone 34a and the third localized zone 34c is controlled and includes establishing and maintaining a target pressure ratio between these two localized zones such that the gas pressure in the third localized zone 34c is much larger than the gas pressure in the first localized zone 34a. In this case, the third localized zone 34c is the volume in which a plume of the coating material from the crucible 24 extends toward the component 30. Since the gas pressure in the third localized zone 34c is much greater than the gas pressure in the first localized zone 34a, the gas pressure in the third localized zone 34c overcomes the gas pressure within the first localized zone 34a within the hood 33. As a result, there is a shift in a balance of how the coating deposits. In this case, the shift is toward depositing more coating material onto surfaces 30a that are in a line-of-sight of the source 26 of coating material in the crucible 24. That is, the greater pressure within the third localized zone 34c results in line-of-sight deposition of the coating material.

Figure 3:
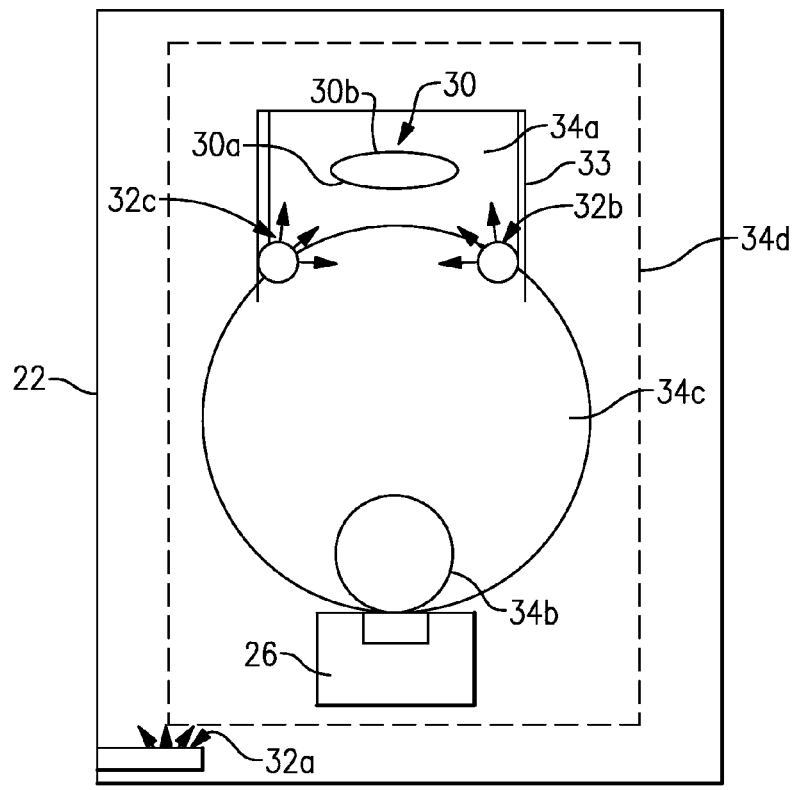
FIG. 3 is similar to FIG. 2 but shows a different pressure differential.

In contrast, in the example illustrated in FIG. 3, the differential pressure between the first localized coating zone 34a and the third localized zone 34c is reduced such that the gas pressure in the third localized zone 34c is still greater than the gas pressure in the first localized zone 34a but is not as great as the differential gas pressure illustrated in FIG. 2. In this case, where the differential gas pressure is smaller, the balance shifts toward deposition of greater amount of coating material onto surfaces 30b of the component 30 that are shadowed from the line-of-sight to the source 26 of coating material in the crucible 24. That is, the smaller differential gas pressure serves to scatter the coating material as it travels from the crucible 24 toward the component 30 to deposit a greater amount of the coating material onto the shadowed surface 30b. In this regard, the controller can dynamically change the differential gas pressures to thus dynamically shift the balance between coating material deposited onto surfaces 30a and coating material deposited onto shadowed surfaces 30b.

Figure 4:
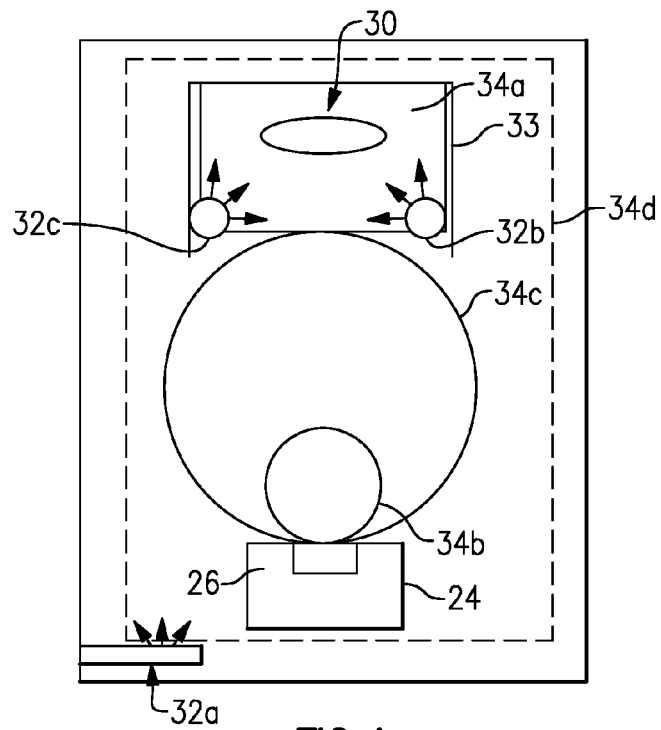
FIG. 4 is similar to FIGS. 2 and 3 but shows a different pressure differential.

In another example illustrated in FIG. 4, the gas pressure in the first localized zone 34a is greater than the gas pressure in the third localized zone 34c. The greater gas pressure in the first localized zone 34a serves a gas screen to limit or eliminate entry of coating material into the first localized zone 34a from the plume within the third localized zone 34c, thus limiting or eliminating deposition of coating material from the crucible 24 onto the component 30. In this case, the greater gas pressure in the localized zone 34a can be used during a pre-heating step to facilitate growth of an oxide scale on the component 30 prior to deposition. Thus, the differential gas pressures between the first localized zone 34a and the third localized zone 34c is used to influence the mechanism of deposition of the coating in that rather than depositing the coating from the source 26 coating material in the crucible 24, the coating is deposited from a different source, such as a reactive process gas delivered from one or more of the gas ports 32b and 32c. For instance, an oxygen-containing gas can be emitted from one or more of gas ports 32b and 32c to react with aluminum or other element of the component 30 to form a desired oxide scale.

In further examples, the controller can dynamically control the gas pressures in any or all of the localized zones 34a, 34b, 34c, and 34d to thus control how a coating is deposited onto the one or more components 30. In one further example, the controller controls flow of process gas from gas port 32a to influence the gas pressure in the fourth localized zone 34d. The gas pressure in localized zone 34d can be established with respect to a gas pressure differential relative to the gas pressure in the third localized zone 34c to constrict the diameter of the coating plume and thus focus the plume to a desirable diameter for depositing the coating onto the component 30. For example, the gas pressure in the fourth localized zone 34d can be controlled with respect to the area, represented at A in FIG. 1, of the melt pool, which is represented at 22a in FIG. 1. The area of a melt pool can be controlled by controlling the parameters of the energy source 26, such as beam power.

In a further example, a critical pressure of the gas pressure in the fourth localized zone 34d can be established and defined with respect to the area of the melt pool. For example, the critical pressure is inversely proportional to the area of the melt pool and is the pressure below which gas separation occurs between oxygen within the third localized zone 34c and the fourth localized zone 34d. The critical pressure relates to oxygen diffusion length from the vapor stream in the third localized zone 34c. As the vapor travels from the crucible 24 toward the component 30 the plume diverges until the pressure of oxygen in the third localized zone 34c equilibrates with the pressure of oxygen in the fourth localized zone 34d. Thus, by establishing a gas pressure in the fourth localized zone 34d that is above the critical pressure, the oxygen diffusion length can be suppressed, which results in a focusing of the plume rather than dissipation to a wider diameter. Accordingly, the differential gas pressure between the fourth localized zone 34d and the third localized zone 34c can be controlled to focus the plume on one or more of the components 30.

Referring again to FIG. 2, the coating apparatus 20 can further include a wave emitter 50 that is operable to emit controlled frequency pressure waves 52 at least in the vicinity of the first localized zone 34a. The wave emitter 50 can also be operably connected with the controller. The controlled frequency pressure waves 52 can be selectively emitted to further enhance a coating process. For example, the controlled frequency pressure waves 52 can be utilized in an ultrasonic frequency range to promote diffusion and separation of coating material entering into the first localized zone 34a, to further control the microstructure and chemistry of a deposited coating.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A method for use in a coating process, the method comprising:
   locating at least one component within a coating chamber with respect to a source of coating material; and
   dynamically changing differential gas pressures between multiple selected localized zones in the coating chamber to dynamically shift a balance between coating material deposited onto surfaces of the at least one component that are in a line-of-sight of the source and coating material deposited onto surfaces of the at least one component that are shadowed from the line-of-sight to the source, the localized zones being selected from a first localized zone around the at least one component, a second localized zone adjacent the source of coating material, a third localized zone that diverges from the second localized zone toward the first localized zone, and a fourth localized zone that circumscribes at least the third localized zone, including dynamically changing differential gas pressure between at least the first localized zone and the third localized zone to form a gas screen that limits entry of coating material into the first localized zone from a plume of coating material within the third localized zone.

2. The method as recited in claim 1, including changing the differential gas pressures to shift between depositing the coating on the at least one component primarily from the source of coating material and depositing the coating on the at least one component primarily from a different source.

3. The method as recited in claim 1, including changing the differential gas pressures to change between two different mechanisms of deposition of the coating on the at least one component.

4. The method as recited in claim 3, wherein the two different mechanisms of deposition of the coating on the at least one component include a first mechanism of physical vapor deposition and a second mechanism of reactive process gas deposition.

5. The method as recited in claim 1, including changing the differential gas pressures to change a direction of impingement of the coating onto the at least one component.

6. The method as recited in claim 1, further comprising emitting controlled frequency pressure waves in at least the first localized zone.

7. The method as recited in claim 1, including dynamically changing a target pressure ratio between at least two of the differential gas pressures of the multiple selected localized zones to change how the coating deposits on the at least one component.

8. The method as recited in claim 7, wherein the target pressure ratio is between the first localized zone and the second localized zone.

9. The method as recited in claim 1, including dynamically decreasing differential gas pressure between at least the first localized zone and the third localized zone to shift the balance toward depositing the coating material onto the surfaces that are shadowed from the line-of-sight to the source.

* * * * *